United States Patent [19]
Allen

[11] Patent Number: 5,502,395
[45] Date of Patent: Mar. 26, 1996

[54] METHOD FOR PROGRAMMING ANTIFUSES FOR RELIABLE PROGRAMMED LINKS

[76] Inventor: William J. Allen, 10120 Lockwood Dr., Cupertino, Calif. 95014-2614

[21] Appl. No.: 249,001

[22] Filed: May 25, 1994

[51] Int. Cl.⁶ .......................... G01R 27/08; G01R 31/02; H01H 37/76
[52] U.S. Cl. .............. 324/713; 324/550; 327/525
[58] Field of Search ..................... 324/713, 715, 324/525, 550; 307/202.1

[56] References Cited

U.S. PATENT DOCUMENTS

| | | | |
|---|---|---|---|
| 4,700,130 | 10/1987 | Bloemen | 307/202.1 |
| 4,701,636 | 10/1987 | Millhollan et al. | 307/202.1 |
| 5,126,282 | 6/1992 | Chiang et al. | 437/172 |
| 5,194,759 | 3/1993 | El-Ayat et al. | 307/202.1 |
| 5,272,388 | 12/1993 | Bakker | 307/202.1 |
| 5,293,133 | 3/1994 | Birkner et al. | 307/202.1 |
| 5,341,043 | 8/1994 | McCollum | 307/443 |

*Primary Examiner*—Maura K. Regan
*Attorney, Agent, or Firm*—Townsend and Townsend and Crew

[57] ABSTRACT

A method for programming antifuses is described. Programming current pulses are driven through a selected antifuse. The resistance through the antifuse is then measured and compared to a predetermined resistance value. These measuring, comparing and driving steps are repeated until the measured resistance is less than a predetermined resistance value and the antifuse is annealed by driving a predetermined amount of current through the antifuse for a first predetermined amount of time and ramping down the current in a predetermined manner in a second predetermined amount of time. With this programming method no complex methods and circuits to reverse the polarities of voltage across and currents through the antifuse are required.

9 Claims, 2 Drawing Sheets

METHOD FOR PROGRAMMING ANTIFUSES FOR RELIABLE PROGRAMMED LINKS

BACKGROUND OF THE INVENTION

The present invention is related to antifuses in integrated circuits and, more particularly, to methods of programming antifuses.

Antifuses are found in a growing number of integrated circuits, most of which are field programmable gate arrays (FPGAs). As the name implies, antifuses have a very high resistance (to form essentially an open circuit) in the unprogrammed ("off") state, and a very low resistance (to form essentially a closed circuit) in the programmed ("on") state. In these integrated circuits antifuses are placed at the intersections of interconnection lines which lead to different elements of the integrated circuit. By programming selected antifuses, the interconnections between the various elements of the integrated circuit are formed to define the function of the device.

In a typical antifuse structure a nonconducting programming layer is sandwiched between two metal interconnection lines. To program an antifuse, a large programming voltage is placed across the antifuse so that the programming layer is ruptured and a programming current passes between the two metal interconnection lines. The result is that the programmed antifuse has a conducting link formed between the two metal interconnection lines.

Nonetheless, there are problems which have been observed in the resistance values, $R_{ON}$, of the programmed antifuse. One problem is that the resistance of the programmed antifuse can vary considerably. This is not desirable since widely varying resistances in the signal paths, i.e., the metal interconnection lines, cause timing problems in the programmed FPGA integrated circuit. Furthermore, high resistances in the programmed antifuses slow the performance of the device.

Another problem is reliability. The $R_{ON}$ of some antifuses have been found to drift even when the integrated circuit is not in use. Not only do timing problems arise in the programmed FPGA, but also the resistance of the nominally programmed antifuse might rise so high so as to be considered an open circuit. This is disastrous since the desired circuit is no longer realized in the programmed integrated circuit.

While antifuse manufacturers have found some solutions to these problems in the design of the antifuse structure itself, other solutions have been found in the manner in which the antifuse is programmed. For instance, some manufacturers have found it efficacious to reverse the flow of programming currents through the antifuse. However, polarity reversals in the programming current requires complex, and correspondingly expensive, programming circuits.

The present invention solves or substantially mitigates these problems without complex programming circuits.

SUMMARY OF THE INVENTION

The present invention provides for a method of programming selected antifuses in an integrated circuit. The method starts by driving a pulse of current through a selected antifuse; measuring a resistance through the antifuse after the initial pulse; comparing the measured resistance with a predetermined resistance value; repeating the measuring, comparing and driving steps until the measured resistance is less than a predetermined resistance value; and driving a predetermined amount of current through the antifuse for a first predetermined amount of time and ramping down the current in a predetermined manner in a second predetermined amount of time.

If the measured resistance does not fall below the predetermined resistance value after a predetermined number of attempts, the current of the programming pulse through the antifuse is increased and a predetermined number of attempts is made at this increased current. The programming current can be increased level-by-level to drive the resistance below the predetermined resistance value. If so, the method returns to the steps of driving a predetermined current through the antifuse for the first predetermined amount of time and ramping down said current in a predetermined manner in the second predetermined amount of time.

With this method of programming, the selected antifuses have low and stable programmed resistances.

BRIEF DESCRIPTION OF THE DRAWINGS

A more detailed understanding of the present invention may be achieved by perusing the following Detailed Description Of Preferred Embodiments of the present invention with reference to the following drawings.

DETAILED DESCRIPTION OF PREFERRED EMBODIMENTS

An FPGA integrated circuit typically has tens of thousands, if not hundreds of thousands, of antifuses. The FPGA has numerous interconnection lines formed from wiring segments with the antifuses at the intersections of the wiring segments. Each wiring segment is selectively connectable to an external programming pin by programming decoders, which are responsive to programming address signals. An antifuse is selected for programming by addressing the two intersecting wiring segments which have the antifuse between them. The programming pins of each of the wiring segments are connected to voltage supplies to create a large voltage across the antifuse to program it. A description of one particular FPGA is found in U.S. patent application, Ser. No. 07/783,659, entitled, "A FIELD PROGRAMMABLE GATE ARRAY, filed Mar. 18, 1991 by Laurence H. Cooke and David Marple, and assigned to the present assignee.

Figure 1A:
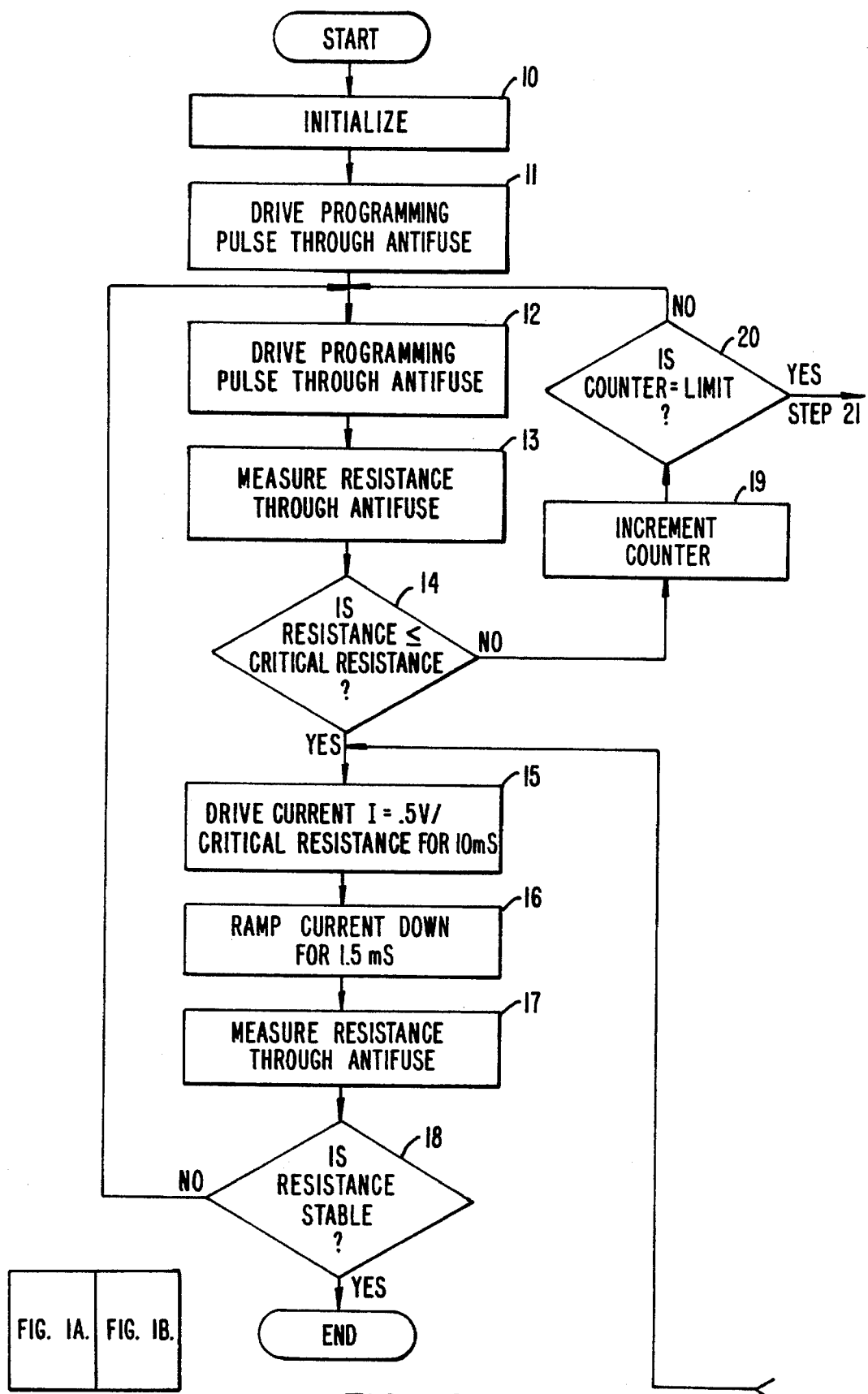
FIGS. 1A and 1B show a flow chart of steps used to program an antifuse according to the present invention.
Figure 1B:
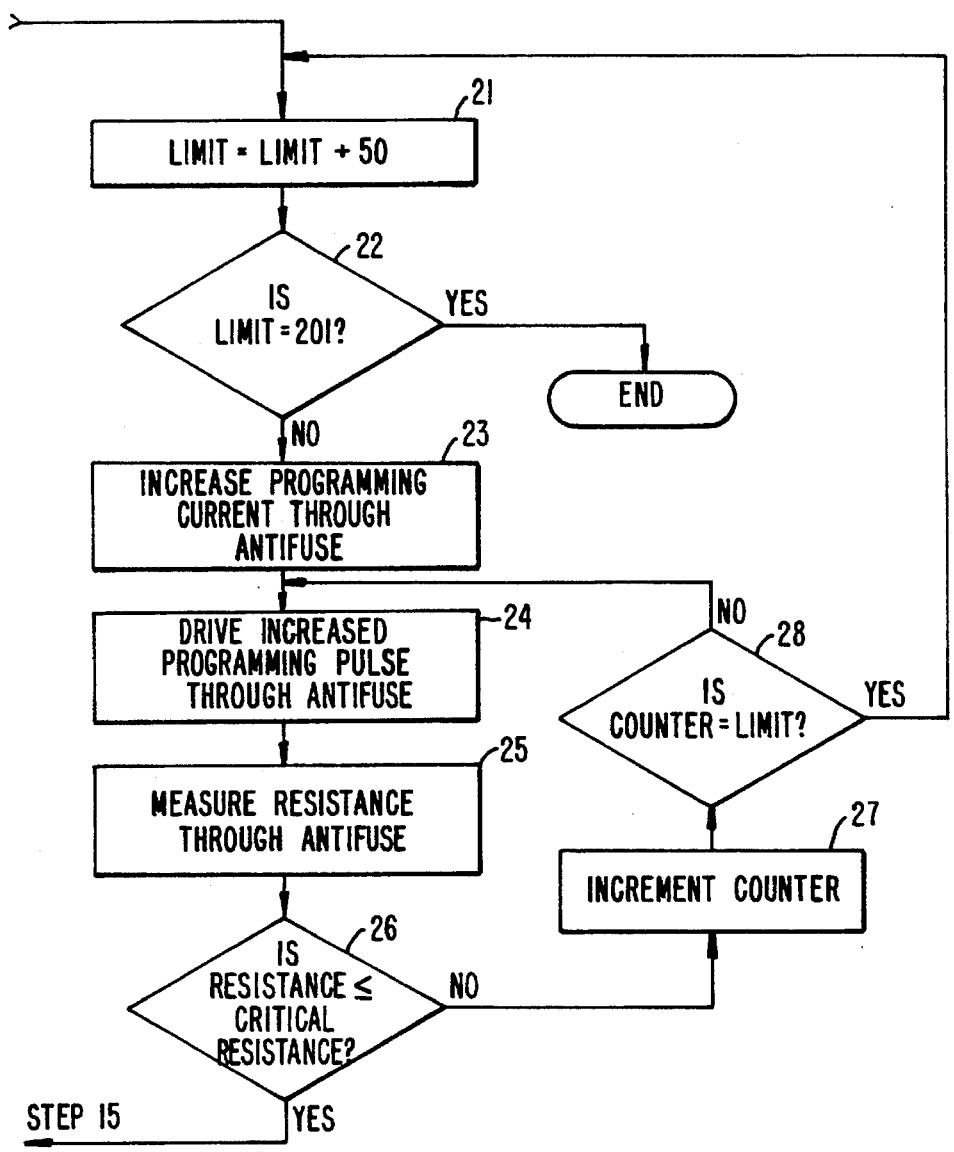

In the programming of the antifuses, it is assumed that FPGA is connected to a programming fixture, which is typically under computer control. The present invention teaches the steps used to program the antifuse after the selection of the antifuse, and as illustrated in FIGS. 1A and 1B.

After the initialization step 10, which includes setting the Limit value=151, a programming pulse is driven through the selected antifuse by step 11. The pulse is 0.5 msec long, which is considered the shortest time possible for programming the antifuse in a controlled manner as described below. The programming current is set to 15 mA, or lower if the lower current is sufficient to program the antifuse. The current is then ramped down to a lower level, in this case, approximately 1 mA. In step 12, a second programming pulse is driven through selected antifuse. The combination of steps 11 and 12 ensures that each selected antifuse is driven by at least two programming pulses. After the pulse is ramped down, the resistance of the antifuse is measured by step 13. The value of the measured resistance is saved for a comparison in step 18 described below.

There are many ways of measuring the resistance through a selected antifuse, but the present invention contemplates using the Kelvin test measurement arrangement as found in U.S. patent application, Ser. No. 08/189,950, entitled "EMBEDDED FUSE RESISTANCE MEASURING CIRCUIT," filed Feb. 1, 1994, by William R. Becker and Michael G. Ahrens, and assigned to the present assignee. The described arrangement permits a direct and accurate measurement of the resistance of the antifuse, though other arrangements may be used.

The measured resistance is checked against a Critical Resistance value. This Critical Resistance value is the resistance determined for the antifuses in a particular FPGA to be the targeted resistance for the antifuse. This Critical Resistance is typically between 30 to 70 ohms with present antifuse technology. If the resistance of the antifuse is equal to or less than the Critical Resistance value by step 14, then two annealing steps 15 and 16 follow.

Step 15 drives a current through the antifuse for 10 milliseconds with a predetermined amount of current defined to create a voltage of 0.5 volts across the antifuse at the Critical Resistance value. Then by step 16, the current is ramped down over a 1.5 millisecond period. The ramp down is such that the decrease in power dissipated by the antifuse is a linear function. These annealing steps 15 and 16 are believed to ease the stress in the link from the programming. It has been found that slower ramp down rates are beneficial than rapid rates and the described ramp down represents the best compromise between stress relief in the programming link and the need to perform the programming function as quickly as possible.

In step 17, the resistance of the antifuse is measured again and tested once more by step 18 to check whether the resistance has remained stable. If so, the programming of the selected antifuse is terminated and another antifuse is selected for programming. If the resistance of the antifuse has not remained stable, i.e., the same as the value measured in step 13, then the programming process returns to step 12 and another programming pulse is then driven through the antifuse.

Returning to the test step 14, if the resistance through the antifuse is greater than the Critical Resistance value after steps 12 and 13, the programming process moves to step 19. A counter is incremented and then tested by step 20 to determine whether the counter has reached the Limit value. Initially, the Limit had been set to 151 so that if the counter is less than 151, the programming process returns to step 12. This allows the selected antifuse to be driven by programming pulses in step 12 150 times if the resistance has not been lowered to the Critical Resistance value.

If the resistance of the selected antifuse still has not been lowered to the Critical Resistance value, then by step 21 in FIG. 2B, the Limit value is increased by 50. Then the Limit value is tested against an arbitrary amount, here shown as 201 by step 22. If not, the programming current through the antifuse is increased by step 23. The increase is by a fixed amount so that the current limit now reaches 20 mA. The increased drive current is pulsed through the antifuse by step 24 and the resistance of the antifuse measured in step 25. By step 26 the resistance is checked against the Critical Resistance value. If the antifuse resistance, $R_{ON}$, is less than the Critical Resistance value, the programming process returns to step 15. If not, the counter is incremented by step 27 and checked whether it has reached the Limit value by step 28. If the Limit value has not been reached, the programming process returns to step 24. If the counter has been found to have reached the Limit value by test step 28, the programming process returns to step 21 and the Limit value is increased by 50 again. The programming steps as described will drive an increased current through the antifuse 50 times. If the antifuse still has not reached the critical resistance value, the programming current is increased by 5 mA (step 23) and another 50 pulses are driven through the recalcitrant antifuse. The test step 22 terminates the programming process after an arbitrary number of pulses have been tried and found ineffective against the selected antifuse.

Figure 2:
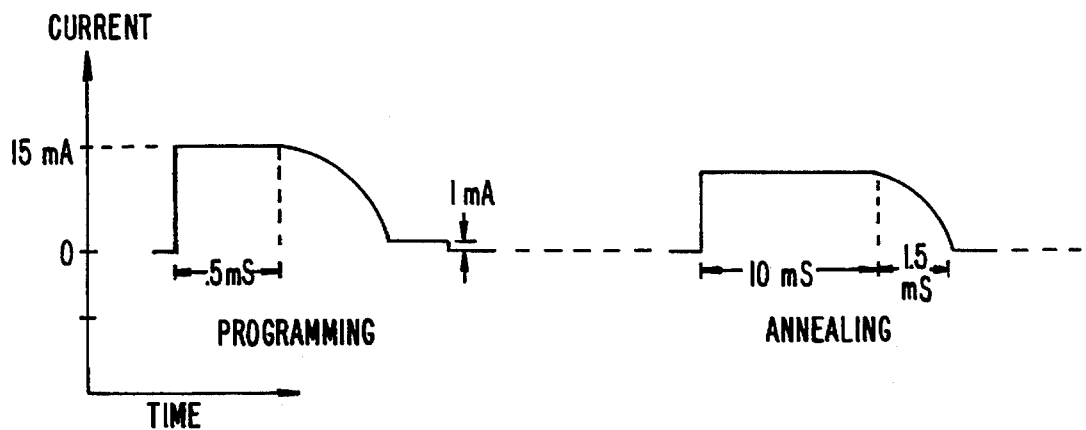
FIG. 2 illustrates the shape of current pulses used to program an antifuse according to the steps of FIGS. 1A and 1B.

FIG. 2 illustrates graphically the programming pulses and annealing current pulse through a selected antifuse.

In the method described above, no programming voltages and currents are reversed and the resulting expense for such programming circuits is avoided. In comparison with such more complex programming techniques, the present invention achieves the same results. That is, the present invention requires no additional programming time and the same programming resistances, $R_{ON}$, are obtained. Furthermore, the programming resistances are stable.

It should be noted that if the resistance of the conducting link of a selected antifuse is not considered important, then the described programming steps need not be implemented for that antifuse. An arbitrary number of programming pulses is typically sufficient to lower the conducting link to a value below 200 ohms in most cases. This procedure saves time. An annealing ramp down pulse is still performed to relieve the stress.

On the other hand, for other antifuses, it might be critical that these antifuses reach the Critical Resistance value. Additional steps may be taken to ensure that goal. For example, the time for each programming pulse might be increased, or the final Limit value might be increased so that there are more opportunities at higher currents to program the antifuse.

While the above is a complete description of the preferred embodiments of the invention, various alternatives, modifications and equivalents may be used. It should be evident that the present invention is equally applicable by making appropriate modifications to the embodiments described above. Therefore, the above description should not be taken as limiting the scope of the invention which is defined by the metes and bounds of the appended claims.

What is claimed is:

1. A method of programming selected antifuses in a plurality of antifuses in an integrated circuit, said method comprising driving a programming pulse of current through a selected previously unprogrammed antifuse;

measuring a resistance through said antifuse after said programming pulse;

comparing said measured resistance with a predetermined resistance value;

repeating said driving, measuring and comparing steps until said measured resistance is less than a predetermined resistance value; and driving a current at a predetermined voltage through said antifuse for a first predetermined amount of time and ramping down said current in a predetermined manner in a second predetermined amount of time;

whereby said selected antifuses have low and stable programmed resistances.

2. The method of claim 1 wherein said programming pulses are unidirectional.

3. The method of claim 1 wherein said pulse driving step comprises driving said pulse of current at a predetermined magnitude for a third predetermined amount of time.

4. The method of claim 3 wherein said predetermined magnitude comprises 15 mA.

5. The method of claim 3 wherein said third predetermined amount of time comprises 0.5 mS.

6. The method of claim 1 wherein said first predetermined amount of time comprises 10 mS.

7. The method of claim 1 wherein said predetermined manner is a linear decrease.

8. The method of claim 3 wherein said repeating step comprises the substep of increasing said predetermined magnitude in said programming pulse driving step after said driving, measuring and comparing steps are repeated a predetermined number of times without said measured resistance having decreased below said predetermined resistance value.

9. The method of claim 1 further comprising the steps of:
- after said current driving step, remeasuring said resistance of said antifuse; and
- if said resistance value has changed, returning to said first driving step.

* * * * *